United States Patent [19]

Matsui

[11] Patent Number: 5,378,947

[45] Date of Patent: Jan. 3, 1995

[54] FILTER CIRCUIT COMPOSED OF GLASS DELAY LINE WITH NO COIL

[75] Inventor: Toshiya Matsui, Tokyo, Japan

[73] Assignee: NEC Corporation, Tokyo, Japan

[21] Appl. No.: 42,939

[22] Filed: Apr. 5, 1993

[30] Foreign Application Priority Data

Apr. 3, 1992 [JP] Japan .................. 4-110684

[51] Int. Cl.⁶ .......................... H03K 5/00; H03H 7/38
[52] U.S. Cl. ........................ 327/552; 333/32; 333/214; 327/553
[58] Field of Search ............ 307/520, 521, 605; 328/167; 333/141, 143, 32, 213, 214, 215

[56] References Cited

U.S. PATENT DOCUMENTS

| | | | |
|---|---|---|---|
| 3,594,593 | 7/1971 | Ho | 307/521 |
| 3,769,603 | 10/1973 | Herchner | 333/215 |
| 4,074,215 | 2/1978 | Rollett | 333/215 |
| 4,565,962 | 1/1986 | Nagano | 333/215 |
| 4,734,660 | 3/1988 | Izumida et al. | 333/141 |
| 4,760,353 | 7/1988 | Perkins | 333/215 |
| 4,812,785 | 3/1989 | Parker | 333/215 |
| 5,142,254 | 8/1992 | Kimura | 333/144 |
| 5,192,884 | 3/1993 | Kusano | 307/520 |
| 5,250,917 | 10/1993 | Honda et al. | 333/214 |
| 5,267,027 | 11/1993 | Ugaki et al. | 333/215 |

FOREIGN PATENT DOCUMENTS

| | | | |
|---|---|---|---|
| 0085917 | 7/1981 | Japan | 333/144 |
| 0048517 | 3/1983 | Japan | 333/144 |
| 0063215 | 4/1983 | Japan | 333/141 |
| 0072817 | 4/1984 | Japan | 333/144 |
| 0001308 | 1/1987 | Japan | 333/141 |

Primary Examiner—Timothy P. Callahan
Assistant Examiner—T. T. Lam

[57] ABSTRACT

A filter circuit comprises a glass delay line for giving a predetermined amount of delay to an input signal, and an active filter connected to the glass delay line for performing an impedance matching for the glass delay line. By changing the transconductance $g_m$ of differential amplifiers which constitute the active filter, the amount of delay of the glass delay line can be adjusted.

3 Claims, 3 Drawing Sheets

FILTER CIRCUIT COMPOSED OF GLASS DELAY LINE WITH NO COIL

BACKGROUND OF THE INVENTION

1. Field of the Invention

The present invention relates to a filter circuit and more specifically to a filter circuit having a glass delay line, which is used in a video signal processing circuit for television receivers, video tape recorders, and the likes.

2. Description of Related Art

In a conventional filter circuit incorporating therein a glass delay line, an video signal is supplied from an input terminal through an impedance conversion buffer to one end of an input filtering capacitor, whose other end is connected through an input resistor to one end of a glass delay line. The one end of the glass delay line is also connected to a variable input coil. The other end of the glass delay line is connected to a resistor and an output coil for an output impedance matching, and an output terminal. With this arrangement, a signal having a predetermined delayed time can be obtained from the output terminal.

Now, operation will be described assuming that the delay time of the glass delay line corresponds to one horizontal scanning period of an NTSC (National Television System Committee) signal, namely to about 63.56 microseconds.

The video signal (NTSC signal) supplied from the input terminal is inputted to the impedance conversion buffer, where it is converted to a low impedance. An output of the buffer is supplied to the filtering capacitor, where a signal component from a direct current to several hundreds KHz is attenuated. An output of the filtering capacitor is supplied to the glass delay line through an input impedance matching circuit composed of the input resistor and the variable input coil.

Here, considering an equivalent circuit of the glass delay line, it can be expressed that each of the input terminal and the output terminal is grounded through a parallel circuit of a resistor Rx and a capacitor Cx. In the case of the glass delay line giving the delay time corresponding to one horizontal scanning period (1H) of the NTSC signal, there has been used a glass delay line of $Rx \approx 560\Omega$ and $Cx \approx 110$ pF. In this case, a resistance Ri of the input resistor and a resistance Ro of the output resistor are set such that $Ri=Ro=Rx=560\Omega$, and an inductance Li of the variable input coil and an inductance Lo of the output coil are set such that $Li=Lo=18$ $\mu$H.

Under this construction, the amount of delay from the input terminal to the output terminal is set to one horizontal scanning period (1H) of the NTSC signal by adjusting the inductance Li of the variable input coil. An output signal obtained from the output terminal is a signal composed of a color signal of the NTSC signal and its neighboring signal, by action of a limited pass band of the glass delay line. Namely, a signal of 3.58 MHz and its neighborhood can be obtained. Accordingly, a color signal delayed from the video signal inputted to the input terminal by the one horizontal scanning period (1H) of the NTSC signal is obtained from the output terminal.

In the above mentioned conventional filter circuit using the glass delay line, since the input and output impedance matching circuits include the variable input coil and the output coil, respectively, external noise signals or disturbance signals are captured by the coils. In addition, the adjustment of the coil requires a mechanical adjustment of the variable input coil, and therefore, it has been difficult to electrically adjust for example by means of a direct current voltage. Furthermore, it is also difficult to implement the filter circuit on an integrate circuit.

SUMMARY OF THE INVENTION

Accordingly, it is an object of the present invention to provide a filter circuit having a glass delay line, which has overcome the above mentioned defect of the conventional one.

Another object of the present invention is to provide a filter circuit having a glass delay line, which is hardly influenced by the external disturbance, and which can be adjusted by an electrical means.

The above and other objects of the present invention are achieved in accordance with the present invention by a filter circuit comprising a glass delay line for giving a predetermined amount of delay to an input signal, and an active filter connected to the glass delay line for performing an impedance matching for die glass delay line.

Preferably, the active filter is constructed to be equivalent to a grounded coil when it is seen from an input terminal.

In one embodiment, the active filter includes a differential amplifier having its transconductance adjusted so as to electrically change the amount of delay of the glass delay line.

With the above mentioned arrangement, the active filter is connected to the glass delay line for performing the input and output impedance matching for the glass delay line. The active filter itself can be adjusted by changing a constant current, so as to change a center frequency $f_o$ of the filter.

The above and other objects, features and advantages of the present invention will be apparent from the following description of preferred embodiments of the invention with reference to the accompanying drawings.

DESCRIPTION OF THE PREFERRED EMBODIMENTS

Figure 1:
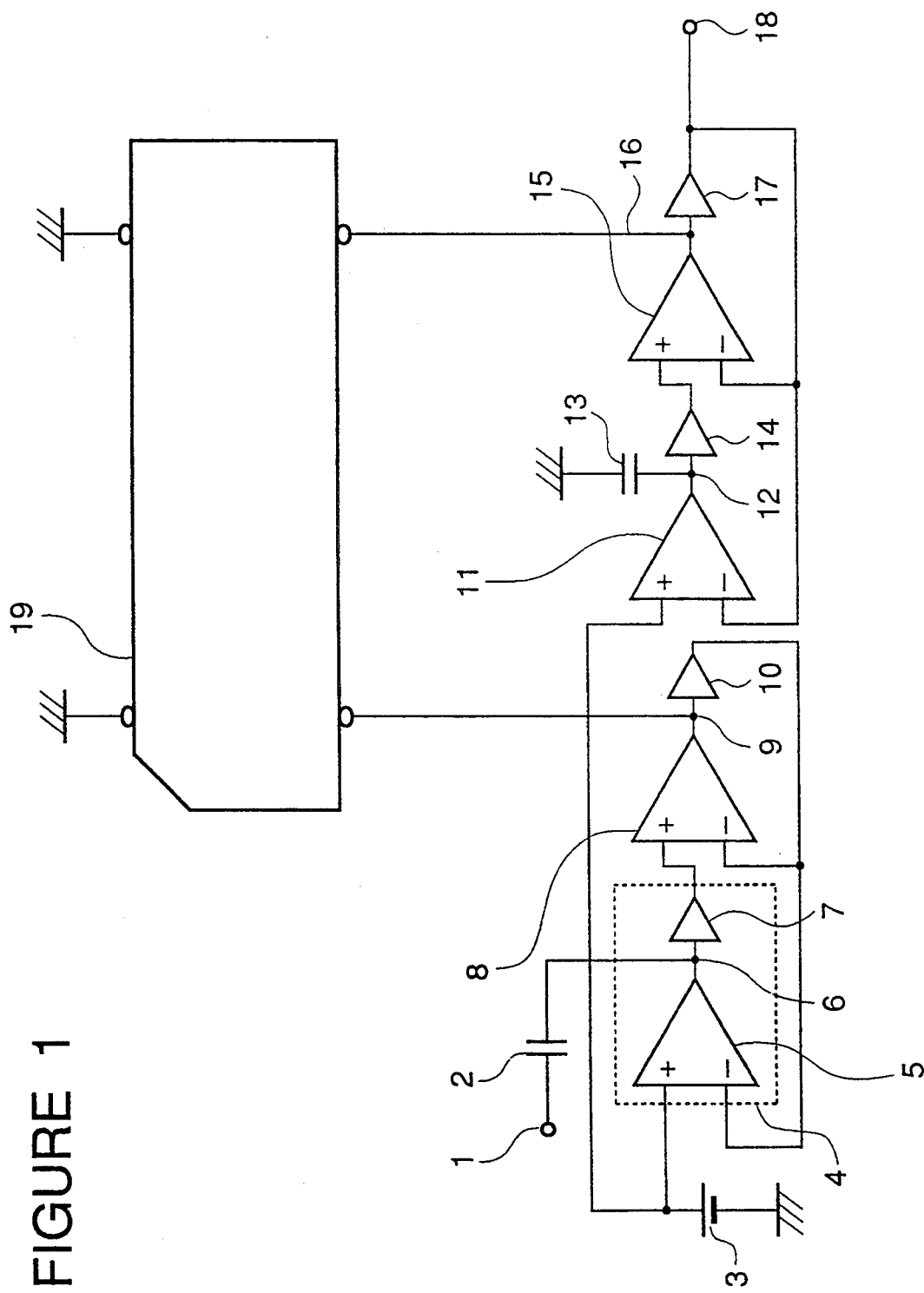
FIG. 1 is a block diagram of one embodiment of the filter circuit having the glass delay line in accordance with the present invention.

Referring to FIG. 1, there is shown a block diagram of one embodiment of the filter circuit having the glass delay line in accordance with the present invention.

The shown filter circuit includes an input terminal 1 for receiving an input signal such as a video signal, and an input capacitor 2 having its one end connected to the input terminal 1. This input capacitor 2 constructs a portion of an input impedance matching active filter.

The input impedance matching active filter is constructed of rite input capacitor 2, a differential amplifier 5 having its non-inverted input to a direct current voltage source 3 and its output 6 connected to the other end of the input capacitor 2, an impedance converting buffer 7 having its input connected to the output of the differential amplifier 5, another differential amplifier 8 having its non-inverted input to an output of the impedance converting buffer 6, and another impedance converting buffer 10 having its input connected to an output 9 of the differential amplifier 8 and its output connected to an inverted input of each of the differential amplifiers 5 and 8. The output 9 of the differential amplifier 8 is connected to an input end "INPUT" of a glass delay line 19.

Similarly, an output impedance matching active filter comprises a differential amplifier 11 having its non-inverted input to the direct current voltage source 3, a filter capacitor 13 connected at its one end to an output 12 of the differential amplifier 11 and grounded at its other end, an impedance converting buffer 14 having its input connected to the output 12 of the differential amplifier 11, another differential amplifier 15 having its non-inverted input to an output of the impedance converting buffer 14, and another impedance converting buffer 17 having its input connected to an output 16 of the differential amplifier 15 and its output connected an inverted input of each of the differential amplifiers 11 and 15. The output 16 of the differential amplifier 15 is connected to an output end "OUTPUT" of the glass delay line 19, and the output of the impedance converting buffer 17 is also connected to an output terminal 18.

Figure 2:
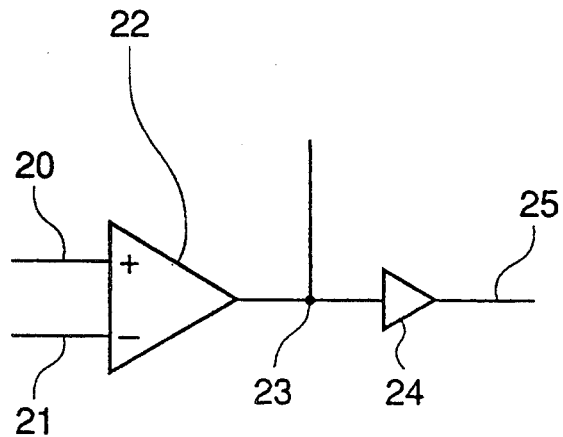
FIG. 2 is a circuit diagram of the differential amplifier included in the filter circuit shown in FIG. 1.
Figure 2:
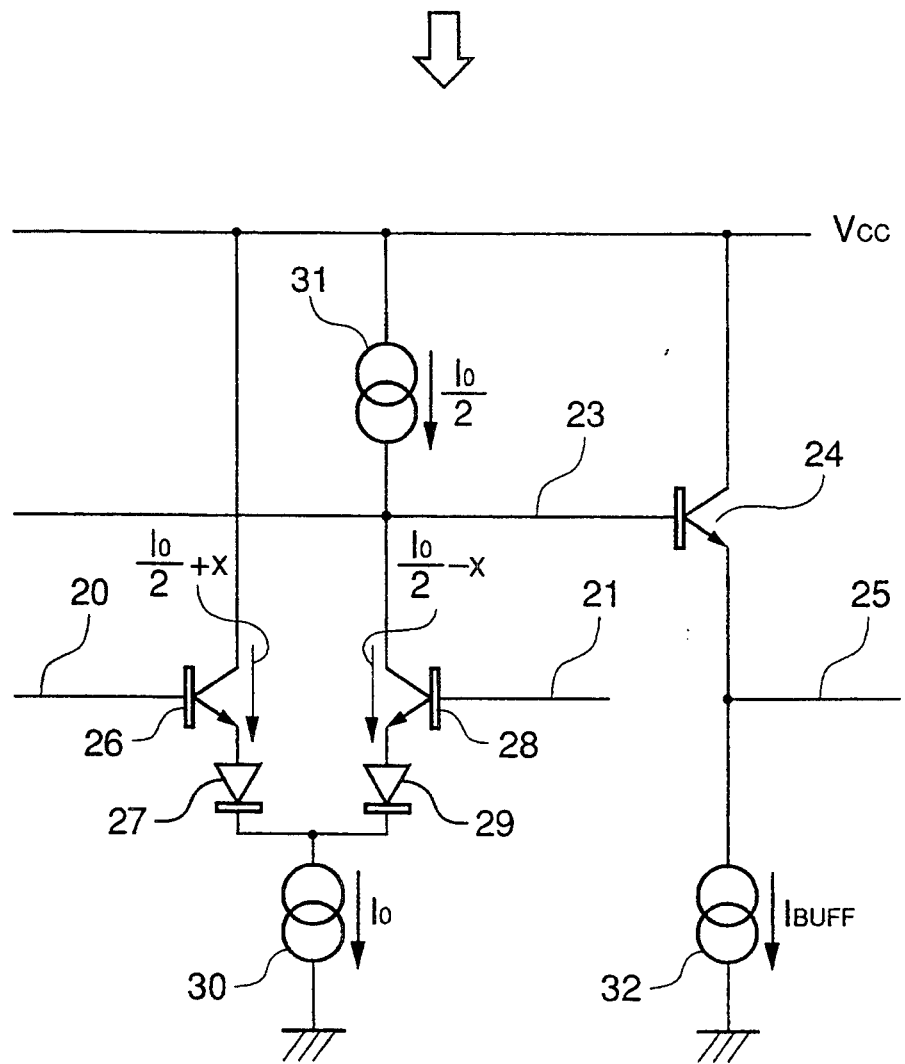

The input impedance matching active filter is constructed to function as a grounded coil when it is seen from the input terminal 1. Referring to FIG. 2, there is shown a circuit diagram of a unitary circuit composed of the differential amplifier and the impedance converting buffer connected thereto, which can be shown by a dotted line block 4 in the filter circuit shown in FIG. 1

The shown unitary circuit includes a differential amplifier 22 having a non-inverted input terminal 20 and an inverted input terminal 21, and an impedance converting buffer 24 having an input connected to an output 23 of the differential amplifier 22 and an output connected to an output terminal 25. The shown unitary circuit corresponds to each of unitary circuits 4 (5+7), 8+10, 11+14, and 15+17 shown in FIG. 1.

The differential amplifier 22 includes a non-inverted signal receiving NPN transistor 26 having a base connected to the non-inverted input terminal 20 and a collector connected to a high level voltage line Vcc, a non-inverted signal receiving diode 27 having its anode connected to an emitter of the transistor 26, an inverted signal receiving NPN transistor 28 having a base connected to the inverted input terminal 21 and a collector connected through a constant current source 31 having a constant current Io/2 to the high level voltage line Vcc, and an inverted signal receiving diode 29 having its anode connected to an emitter of the transistor 28. A cathode of the diodes 27 and 29 is connected in common to one end of another constant current source 30 having a constant current Io, whose other end is connected to a ground. In addition, the impedance converting buffer 24 includes a third NPN transistor having a base connected to the collector of the transistor 28. A collector of the transistor 24 is connected to the high level voltage line Vcc. An emitter of the transistor 24 is connected to the ground through a constant current source 32 having a constant current $I_{BUFF}$, and also connected to the output terminal 25.

In the shown differential amplifier, a transconductance $g_m$ is expressed by Io/8 $V_T$ (where $V_T=kT/q$) in a region around a balanced point of the differential circuit, and therefore, can be determined by the reference current value Io of the constant current sources. By adding a capacitor to the current output 23 of this differential amplifier, it is possible to construct a filter. For example, if a capacitor having a capacitance "C" is connected between the current output 23 of this differential amplifier and the ground, and if the output terminal 25 is connected to the inverted input 21 of the differential amplifier so that a full feedback loop is constructed, a transfer function from the non-inverted input 20 to the output terminal 25 can be expressed with $1/(1+j\omega \cdot C/g_m)$.

By using this differential amplifier, the input impedance matching circuit and the output impedance matching circuit are constructed in the embodiment shown in FIG. 1.

Figure 3:
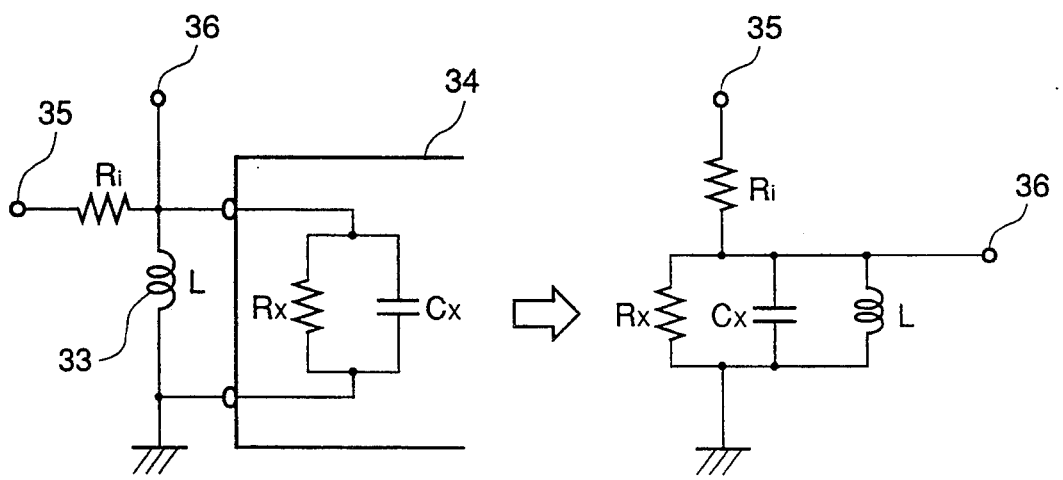
FIG. 3 is a equivalent circuit diagram of the glass delay line shown in FIG. 1 and an associated impedance matching circuit composed of a resistor and a coil.

Now, the input impedance matching will be described with reference to FIG. 3, which shows an equivalent circuit diagram when the impedance matching is realized by a coil and a resistor. In FIG. 3, Reference Numeral 33 designates an impedance matching coil having an inductance L, and Reference Numeral 34 shows the glass delay line. Ri is an input resistor, and Rx and Cx are a resistance component and a capacitance component of an equivalent circuit of an input (or output) of the glass delay line. In the equivalent circuit shown in FIG. 3, an input impedance Zi(s) can be expressed as follows:

$$Zi(s) = \frac{1 + S\left(\frac{1}{Rx} + \frac{1}{Ri}\right)L + S^2 L Cx}{1 + S\frac{L}{Rx} + S^2 L Cx} \cdot Ri$$

A transfer function $T_1(s)$ from die input terminal 35 to the output terminal 36 can be expressed as follows:

$$T_1(s) = \frac{S\frac{L}{Ri}}{1 + S\left(\frac{1}{Rx} + \frac{1}{Ri}\right)L + S^2 L Cx}$$

Therefore, by substituting Rx=Ri, the transfer function $T_1(s)$ can be modified as follows:

$$T_1(s) = \frac{\frac{L}{Ri} S}{1 + 2\frac{L}{Ri} S + S^2 L Cx}$$

Figure 4:
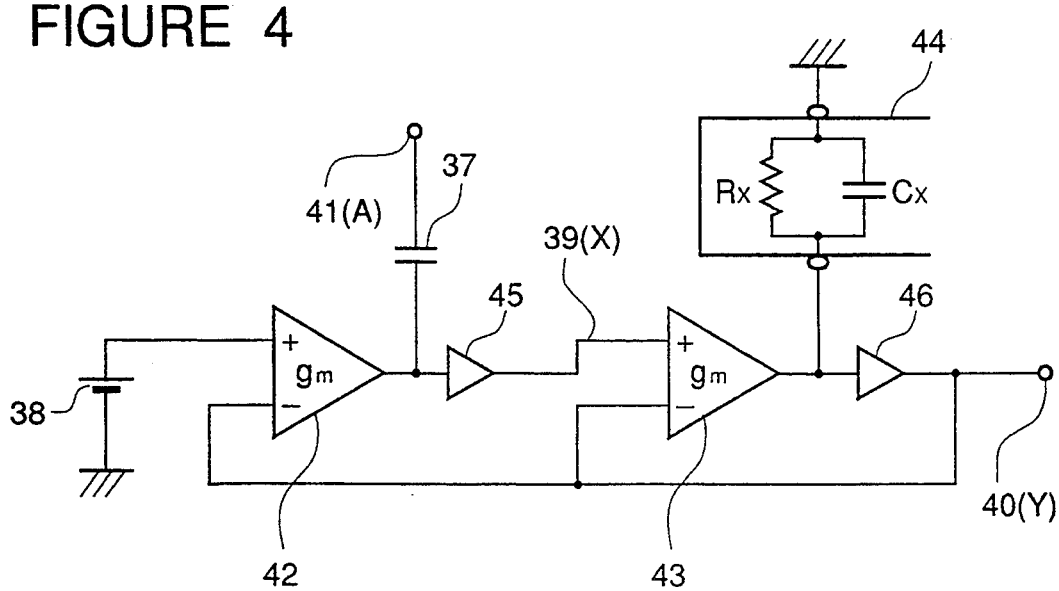
FIG. 4 is a circuit diagram illustrating an operation of the impedance matching circuit shown in FIG. 1.

Therefore, if the transfer function $T_1(s)$ can be realized by the active filter shown in FIG. 1, the impedance matching circuit shown in FIG. 3 can be realized by an active filter. Referring to FIG. 4, there is shown is a circuit diagram of the impedance matching circuit formed of the active filter. In FIG. 4, Reference Numeral 38 shows a direct current voltage source, which corresponds to the voltage source 3 in FIG. 1, and Reference Numerals 42 and 43 designate differential amplifiers, which corresponds to the differential amplifiers 5 and 8, respectively, or the differential amplifiers 11 and 15, respectively, in FIG. 1. A filter capacitor 37 corresponds to the capacitor 2 or 13 in FIG. 1. Reference Numeral 44 indicates a glass delay line, which corresponds to the glass delay line 19 in FIG. 1. Numerals 45 and 46 designate impedance converting buffers, which correspond to the impedance converting buffers 7 and 10, respectively, or the impedance converting buffers 14 and 17, respectively, in FIG. 1.

A transfer function of the circuit shown in FIG. 4 can be derived as follows: Here, assume that a signal "A" is supplied through an input terminal 41 to the filter capacitor 37, and the pair of differential amplifiers 42 and 43 constituting the active filter have the same transconductance $g_m$. The direct current voltage source 38, which determines an operating point of the differential amplifiers 42 and 43, is connected to the non-inverted input of the differential amplifier 42. Also assume that a signal X is outputted from the signal output 39 of the impedance converting buffer 45, and a signal Y is outputted from the signal output 40 of the impedance converting buffer 46.

Under the above mentioned condition, the signal X and the signal Y can be expressed as follows:

$$\begin{cases} X = -Y \cdot g_m \frac{1}{SC} + A & (1) \\ Y = (X - Y) \cdot g_m \cdot \frac{Rx}{1 + SCxRx} & (2) \end{cases}$$

From the above equations (1) and (2), $$Y = \frac{\frac{SC}{g_m}}{1 + SC\left(\frac{C}{g_m^2 Rx} + \frac{C}{g_m}\right) + S^2 \frac{C Cx}{g_m^2}} \cdot A$$

Here, substituting $g_m = 1/Rx$, $$Y = \frac{S C Rx}{1 + 2 S C Rx + S^2 C Cx Rx^2} \cdot A$$

Therefore, the transfer function $T_2(s)$ from the input terminal 41 to the output terminal 40 can be expressed as follows:

$$T_2(s) = \frac{S C R x}{1 + 2 S C Rx + S^2 C Cx Rx^2}$$

Accordingly, in order to fulfil $T_2(s) = T_1(s)$, the following is the necessary condition:

$$\frac{L}{Ri} = \frac{L}{Rx^2} = CRx$$

$$\therefore C = \frac{L}{Rx^2}$$

Namely, if the capacitance C in the filter capacitor 37 in FIG. 4 is set to fulfil the above equation, $T_2(s) = T_1(s)$ can be realized. Similarly, the output impedance matching active filter can be derived, and the output impedance matching active filter will have a construction similar to the input impedance matching active filter. In this connection, by constructing the differential amplifier as shown in FIG. 2, the transconductance $g_m$ can be determined by adjusting the constant current Io.

In addition, in the case of manufacturing the constant current source Io for temperature compensation, if the constant current source Io is constructed to have a temperature characteristics of kT/q, it is possible to give the temperature compensation.

In the above mentioned filter circuit in accordance with the present invention having the glass delay line, since the impedance matching active filter is provided for each of the input and the output of the glass delay line, and since the center frequency $f_o$ of the active filter can be changed by changing the constant current, the filter circuit can be realized with requiring no coil as an external parts, and therefore, can be easily implemented on an integrated circuit. In addition, any mechanical adjustment is no longer necessary, and the adjustment can be performed by an electrical means.

The invention has thus been shown and described with reference to the specific embodiments. However, it should be noted that the present invention is in no way limited to the details of the illustrated structures but changes and modifications may be made within the scope of the appended claims.

I claim:

1. A filter circuit comprises an input terminal for receiving an input signal, an output terminal for outputting a delayed signal, a glass delay line for delaying said input signal, said glass delay line having an input end and an output end, an input impedance matching active filter connected to said input terminal and coupled to said input end of said glass delay line for performing an input impedance matching for said glass delay line, and an output impedance matching active filter connected to said output terminal and coupled to said output end of said glass delay line for performing an output impedance matching for said glass delay line, each of said input and output impedance matching active filters being composed of a first differential amplifier having its non-inverted input to a direct current voltage source, a first impedance converting buffer having its input connected to an output of said first differential amplifier, a second differential amplifier having its non-inverted input connected to an output of said first impedance converting buffer, and a second impedance converting buffer having its input connected to an output of said second differential amplifier, an output of said second impedance converting buffer being connected to an inverted input of each of said first and second differential amplifiers, said output of said first differential amplifier of said input impedance matching active filter being connected to said input terminal through an input capacitor, and said output of said second differential amplifier of said input impedance matching active filter being connected to said input end of said glass delay line, and said output of said first differential amplifier of said output impedance matching active filter being connected to a filter capacitor, and said output of said second differential amplifier of said output impedance matching active filter being connected to said output end of said glass delay line, said output of said second impedance converting buffer of said output impedance matching active filter being connected to said output terminal.

2. A filter circuit claimed in claim 1 wherein when each of said input end and said output end of said glass delay line is expressed by an equivalent circuit composed of a parallel connected circuit of a resistor having the resistance Rx and a capacitor having a capacitance Cx, each of said input capacitor and said filter capacitor has a capacitance C expressed by $C = 1/Rx^2$.

3. A filter circuit claimed in claim 2 wherein each of said differential amplifiers has the transconductance $g_m$ expressed by $g_m = 1/Rx$.

* * * * *